(12) United States Patent
Horiuchi et al.

(10) Patent No.: US 11,721,574 B2
(45) Date of Patent: Aug. 8, 2023

(54) MEMBER FOR ELECTROSTATIC CHUCK AND ELECTROSTATIC CHUCK

(71) Applicant: SHINKO ELECTRIC INDUSTRIES CO., LTD., Nagano (JP)

(72) Inventors: Michio Horiuchi, Nagano (JP); Masaya Tsuno, Matsumoto (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 76 days.

(21) Appl. No.: 17/381,790

(22) Filed: Jul. 21, 2021

(65) Prior Publication Data
US 2022/0037187 A1 Feb. 3, 2022

(30) Foreign Application Priority Data
Aug. 3, 2020 (JP) .................................. 2020-132023

(51) Int. Cl.
*H01L 21/683* (2006.01)
*H01J 37/32* (2006.01)

(52) U.S. Cl.
CPC .... *H01L 21/6833* (2013.01); *H01J 37/32642* (2013.01)

(58) Field of Classification Search
CPC ........................ H01L 21/6833; H01J 37/32642
See application file for complete search history.

(56) References Cited

U.S. PATENT DOCUMENTS

| | | | |
|---|---|---|---|
| 2007/0142205 A1 | 6/2007 | Yoshikawa et al. | |
| 2008/0242531 A1 | 10/2008 | Teratani et al. | |
| 2009/0220404 A1 | 9/2009 | Yoshikawa et al. | |
| 2013/0285336 A1* | 10/2013 | Ito ....................... | H01L 21/6833 252/520.2 |
| 2015/0179412 A1* | 6/2015 | Chhatre ............ | H01J 37/32477 156/345.52 |

FOREIGN PATENT DOCUMENTS

| | | |
|---|---|---|
| JP | 2007-191383 | 8/2007 |
| JP | 2008-239386 | 10/2008 |

* cited by examiner

*Primary Examiner* — Scott Bauer
(74) *Attorney, Agent, or Firm* — Rankin, Hill & Clark LLP

(57) ABSTRACT

A lanthanoid element is included in a part of a material of a member for an electrostatic chuck configured to suck a target object by using an electrostatic force. When electromagnetic waves in a wavelength region shorter than 400 nm are irradiated, the member emits light in a wavelength region different from the wavelength region.

11 Claims, 4 Drawing Sheets

MEMBER FOR ELECTROSTATIC CHUCK AND ELECTROSTATIC CHUCK

CROSS-REFERENCE TO RELATED APPLICATIONS

This application is based on and claims the benefit of priority from prior Japanese patent application No. 2020-132023 filed on Aug. 3, 2020, the entire contents of which are incorporated herein by reference.

TECHNICAL FIELD

The present invention relates to a member for an electrostatic chuck and an electrostatic chuck.

BACKGROUND ART

In general, when manufacturing a semiconductor component, for example, an electrostatic chuck (ESC) configured to suck and hold a wafer is used in some cases. The electrostatic chuck has a structure where a ceramic plate having an electrode embedded therein is fixed to a base plate. The electrostatic chuck is configured to suck the wafer to the ceramic plate by using an electrostatic force as a voltage is applied to the electrode embedded in the ceramic plate. By sucking and holding the wafer on the ceramic plate, it is possible to efficiently perform processes on the wafer, such as fine processing, etching and the like, for example.

For example, in a plasma etching process on the wafer, the wafer is sucked and fixed by the electrostatic chuck provided in a chamber of an etching apparatus. By plasma generated in the chamber, the wafer fixed on the electrostatic chuck is etched. When performing the accurate plasma etching, a plasma state generated in the chamber may be monitored and fed back for control of etching conditions.

As a method of monitoring the plasma state, there is a method of acquiring a plasma generation situation in the chamber by an optical sensor, through a chamber window formed on the chamber. Specifically, electromagnetic waves within a wavelength range of 200 to 1000 nm, including visible light generated in the chamber, are measured by the optical sensor, so that the plasma state is monitored and an end point of the etching is detected.

CITATION LIST

Patent Literature

[PTL 1] JP-A-2008-239386
[PTL 2] JP-A-2007-191383

In the meantime, in industrial fields where the electrostatic chuck is used, an influence of electromagnetic waves in regions shorter than the visible light wavelength is examined. For example, problems of exposure of the electromagnetic waves in the ultraviolet region, which is generated in the plasma etching process, are confirmed. Specifically, in the plasma etching process, it is thought that the wafer sucked on the electrostatic chuck is subjected to three types of damages, i.e., a charging damage due to the plasma, an ion irradiation damage and an ultraviolet irradiation damage. Among others, it is confirmed that the ultraviolet irradiation damage denatures dielectric parts, which are particularly included in the wafer, thereby causing deterioration in quality.

The ultraviolet rays are electromagnetic waves within a wavelength range of 10 to 400 nm, and are largely divided into a long wavelength region UVA (400 to 315 nm), a middle wavelength region UVB (315 to 280 nm) and a short wavelength region UVC (280 nm or shorter), from a standpoint of characteristics thereof. Normally, the shorter the wavelength is, the higher the energy is and the stronger the chemical action is. The short wavelength region of 200 nm or shorter, which is called vacuum ultraviolet, of the short wavelength region UVC has a great influence on the wafer in the plasma etching process.

However, there is a problem that it is difficult to monitor the electromagnetic waves in the vacuum ultraviolet region during the plasma etching process. Specifically, for example, according to the method of monitoring an inside of the chamber through the chamber window formed on the chamber of the etching apparatus, since the electromagnetic waves in the vacuum ultraviolet region do not pass through the chamber window, a sensor provided outside the chamber does not detect generation of the vacuum ultraviolet in the chamber. Specifically, the chamber window is formed using, for example, quartz glass or Pyrex (registered trademark) glass. A transmission wavelength of the quartz glass is, for example, 200 nm or longer, and a transmission wavelength of Pyrex glass is, for example, 350 nm or longer. Therefore, it is difficult to observe the vacuum ultraviolet generated in the chamber from an outside of the chamber window.

Further, since the electromagnetic waves in the vacuum ultraviolet region are absorbed by oxygen molecules and nitrogen molecules, it is basically difficult to measure the same in the atmosphere. Due to these reasons, it is difficult to monitor a generation situation of the vacuum ultraviolet, which is harmful to the wafer, in the plasma etching process.

SUMMARY OF INVENTION

Aspect of non-limiting embodiments of the present disclosure is to provide a member for an electrostatic chuck and an electrostatic chuck capable of monitoring a generation situation of ultraviolet rays in a semiconductor manufacturing process. Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a member for an electrostatic chuck configured to suck a target object by using an electrostatic force, wherein a lanthanoid element is included in a part of a material of the member, and wherein when electromagnetic waves in a wavelength region shorter than 400 nm are irradiated, the member emits light in a wavelength region different from the wavelength region of the electromagnetic waves.

According to one aspect of the member for an electrostatic chuck and the electrostatic chuck disclosed in the present disclosure, it is possible to monitor a generation situation of ultraviolet rays in a semiconductor manufacturing process.

BRIEF DESCRIPTION OF DRAWINGS

Exemplary embodiment(s) of the present invention will be described in detail based on the following figures, wherein.

DESCRIPTION OF EMBODIMENTS

Hereinafter, one embodiment of the member for an electrostatic chuck and the electrostatic chuck disclosed in the present disclosure will be described in detail with reference to the drawings. Note that, the present invention is not limited to the embodiment.

Figure 1:
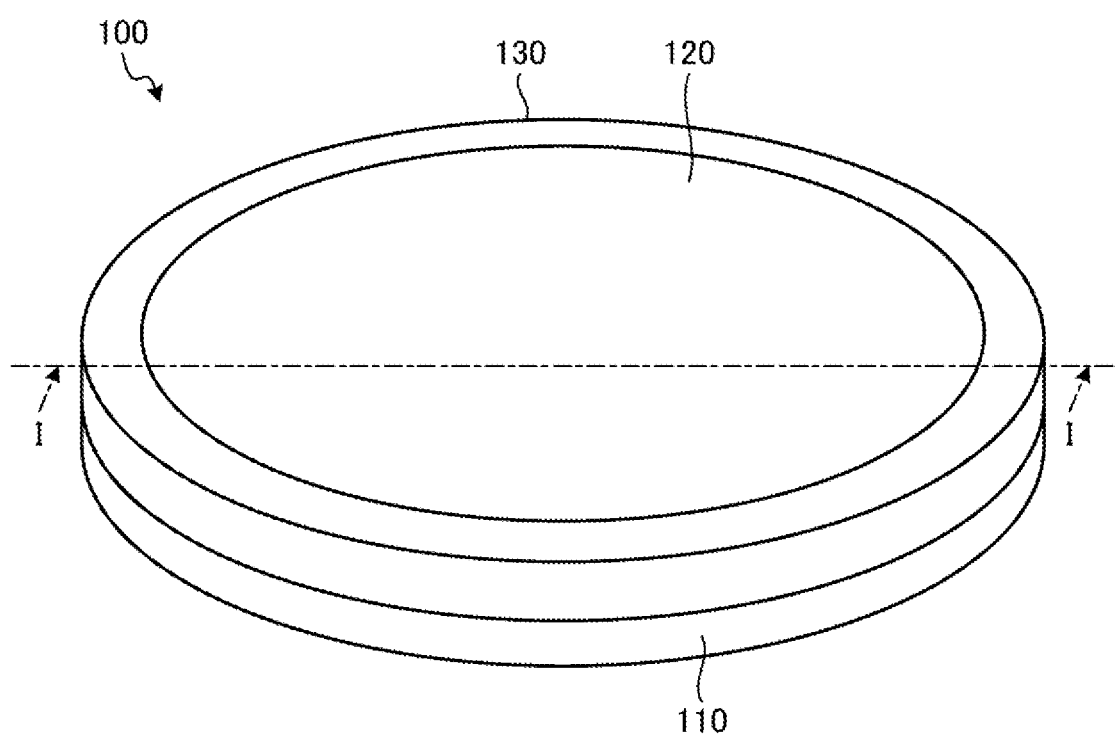
FIG. 1 is a perspective view showing a configuration of an electrostatic chuck according to one embodiment.

FIG. 1 is a perspective view showing a configuration of an electrostatic chuck 100 according to one embodiment. The electrostatic chuck 100 shown in FIG. 1 includes a base plate 110, a ceramic plate 120 and an edge ring 130.

The base plate 110 is, for example, a circular member made of metal such as aluminum, and is a base material of the electrostatic chuck 100. The base plate 110 is formed therein with a coolant passage through which a coolant such as cooling water is to pass, for example, so that temperatures of the ceramic plate 120 and a wafer or the like sucked on the ceramic plate 120 are regulated.

The ceramic plate 120 is a circular member made of insulating ceramic. A diameter of the ceramic plate 120 is smaller than a diameter of the base plate 110, and the ceramic plate 120 is fixed to a center of the base plate 110. Specifically, one surface of the ceramic plate 120 is an adhesion surface that adheres to the base plate 110, and the adhesion surface adheres to the base plate 110, so that the ceramic plate 120 is fixed. An opposite surface of the ceramic plate 120 to the adhesion surface is, for example, a suction surface on which a suction target object such as a wafer is sucked.

In the ceramic plate 120, a conductive electrode is arranged. The electrode is energized to generate an electrostatic force, so that a target object is sucked on the suction surface of the ceramic plate 120. Note that, the adhesion surface of the ceramic plate 120 may adhere to the base plate 110 via a heater layer consisting of a heater electrode and an insulating resin. The heater layer is configured to generate heat as the heater electrode is energized, thereby regulating temperatures of the ceramic plate 120 and a wafer or the like sucked on the ceramic plate 120.

The edge ring 130 is a ring-shaped member configured to surround the ceramic plate 120. Specifically, an inner diameter of the edge ring 130 is substantially the same as a diameter of the ceramic plate 120, and an outer diameter of the edge ring 130 is substantially the same as a diameter of the base plate 110. The edge ring 130 is fitted on an outer periphery of the ceramic plate 120 protruding on the base plate 110, thereby protecting an adhesion part between the base plate 110 and the ceramic plate 120 and an outer peripheral surface of the ceramic plate 120.

The edge ring 130 is mainly made of insulating ceramic, and contains, for example, a lanthanoid element such as cerium. Specifically, the edge ring 130 is made of, for example, ceramic having aluminum oxide as a main component or ceramic having aluminum oxide and magnesium oxide as main components, and contains cerium of 0.5 to 10 mol %, for example.

When electromagnetic waves in a wavelength region of 10 to 400 nm are irradiated, the lanthanoid element contained in the edge ring 130 emits photoluminescence light that is electromagnetic waves in a wavelength region different from the wavelength region. Specifically, when the ultraviolet rays having a wavelength of 10 to 400 nm are irradiated, the edge ring 130 emits the visible light having a wavelength of 400 nm or longer, for example, so that it emits the light as a whole. An amount of luminescence of the edge ring 130 corresponds to an amount of irradiation of the ultraviolet rays. Therefore, for example, the more the amount of irradiation of the ultraviolet rays is, the edge ring 130 emits brighter light.

Figure 2:
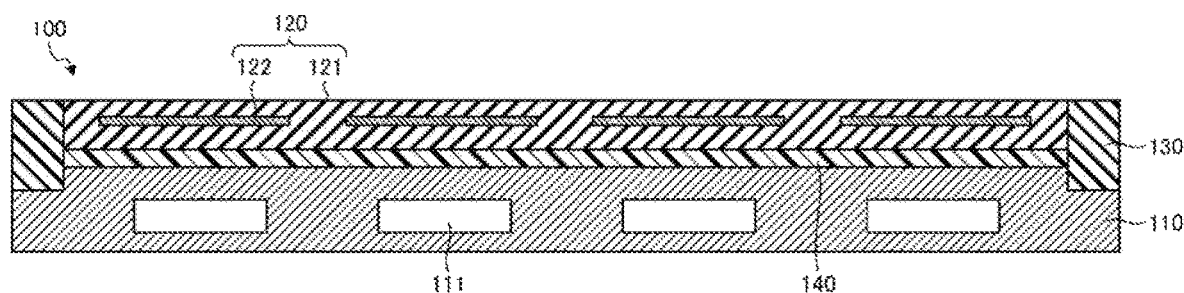
FIG. 2 is a schematic view showing a section of the electrostatic chuck according to one embodiment.

FIG. 2 is a schematic view showing a section taken along a line I-I of FIG. 1. As shown in FIG. 2, the electrostatic chuck 100 has a configuration where the edge ring 130 is fitted on the outer periphery of the ceramic plate 120 that adheres to the base plate 110.

The base plate 110 is a metal member having a thickness of about 20 to 50 mm, in which a coolant passage 111, which is a passage of a coolant such as cooling water, is formed. The coolant passes through the coolant passage 111, so that the ceramic plate 120 and the wafer sucked on the ceramic plate 120 are cooled. A central part of the base plate 110 to which the ceramic plate 120 adheres is formed with a convex portion having a step from the periphery, and the edge ring 130 is fitted on an outer periphery of the convex portion and an outer periphery of the ceramic plate 120.

The ceramic plate 120 has a ceramic layer 121 and an electrode 122, and is bonded to the convex portion at the center of the base plate 110 by an adhesion layer 140. The ceramic layer 121 is made of ceramic having corundum obtained by sintering aluminum oxide or spinel obtained by sintering aluminum oxide and magnesium oxide, as a main component. Specifically, the ceramic layer 121 is made of ceramic in which a corundum phase or a spinel phase occupies by 90% or more, for example. When a voltage is applied to the electrode 122, the ceramic layer 121 sucks a target object such as a wafer by the electrostatic force. Specifically, in FIG. 2, an upper surface of the ceramic plate 120 is the suction surface, so that when the voltage is applied to the electrode 122, a target object is sucked on the suction surface.

A lower surface of the ceramic plate 120 is the adhesion surface that adheres to the base plate 110, and is bonded to the convex portion of the base plate 110 by the adhesion layer 140. As an adhesive that forms the adhesion layer 140, for example, a silicon-based adhesive may be used.

The edge ring 130 is fitted on the outer periphery of the convex portion of the base plate 110 and the outer periphery of the ceramic plate 120, thereby protecting the outer periphery of the ceramic plate 120 including the adhesion layer 140. The edge ring 130 is made of a sintered body of aluminum oxide or a sintered body of aluminum oxide and magnesium oxide, which contains a lanthanoid element such as cerium, for example. The lanthanoid element contained in the edge ring 130 is not limited to cerium, and may be any one element of 15 elements from lanthanum to ruthenium.

For example, in a case where the edge ring 130 is formed of aluminum oxide and cerium, cerium oxide ($CeO_2$) powders having a purity 99.9% by weight are added in an amount of 1 mol % to aluminum oxide powders having a purity of 99.99% by weight and an average particle diameter smaller than 1 μm, which are then wet-mixed in an alcohol-based liquid medium. Then, the obtained slurry material is formed into a ring shape, and the formed body is reduction-fired at temperatures of 1,500° C. or higher in a nitrogen gas atmosphere including hydrogen, for example, so that a sintered body is obtained.

Figure 3:
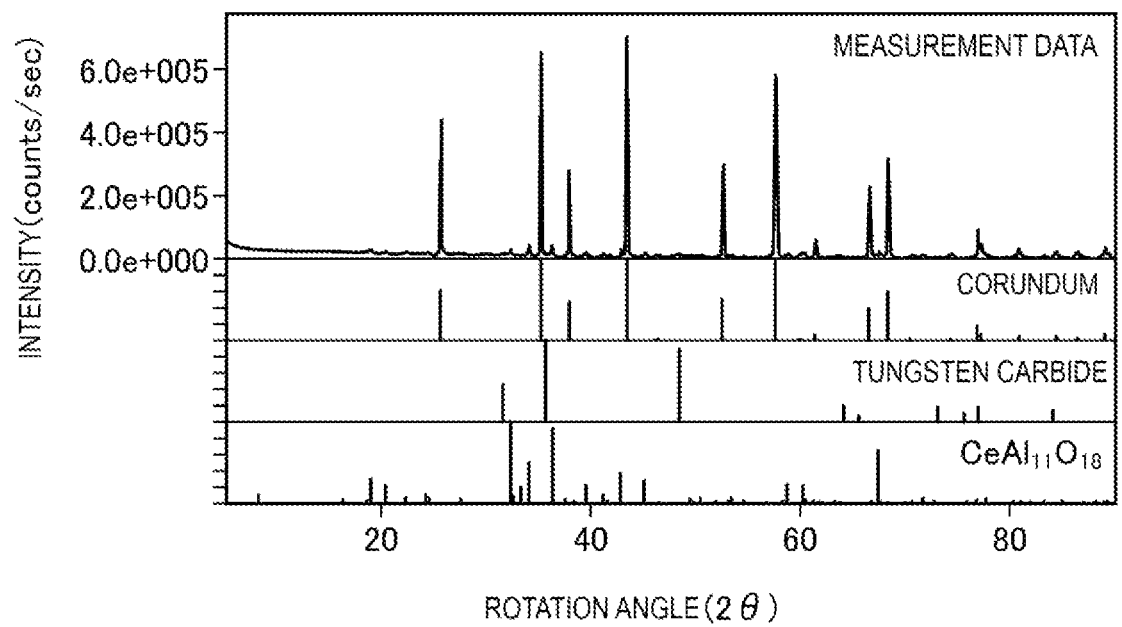
FIG. 3 shows a specific example of an X-ray diffraction pattern.

In this way, the ceramic edge ring 130 made of ceramic containing cerium and having aluminum oxide as a main component is formed. FIG. 3 shows a specific example of an X-ray diffraction pattern of a sample in which the edge ring 130 formed in this way is powdered.

As shown in FIG. 3, the measurement data obtained from the sample shows that the sample consists mostly of a corundum phase and also includes a $CeAl_{11}O_{18}$ phase due to the added cerium oxide. Specifically, it can be seen that the edge ring 130 is formed of ceramic consisting of the corundum phase and the $CeAl_{11}O_{18}$ phase. Note that, the measurement data shows that tungsten carbide is also detected. This is contamination caused due to a grinding medium material used to obtain the sample.

In this way, since the edge ring 130 is formed of the material including cerium that is a lanthanoid element, the edge ring 130 has a photoluminescence property to the ultraviolet rays. Hence, when the ultraviolet rays are irradiated, the edge ring 130 emits bluish white light, for example. Specifically, when the ultraviolet rays having a wavelength of 10 to 400 nm including the vacuum ultraviolet are irradiated, the edge ring 130 emits the visible light having a wavelength of 400 nm or longer different from the ultraviolet rays. For this reason, for example, in a plasma etching process on the wafer sucked by the electrostatic chuck 100, it is possible to monitor whether the ultraviolet rays are irradiated to the wafer, depending on whether the edge ring 130 emits light.

Figure 4:
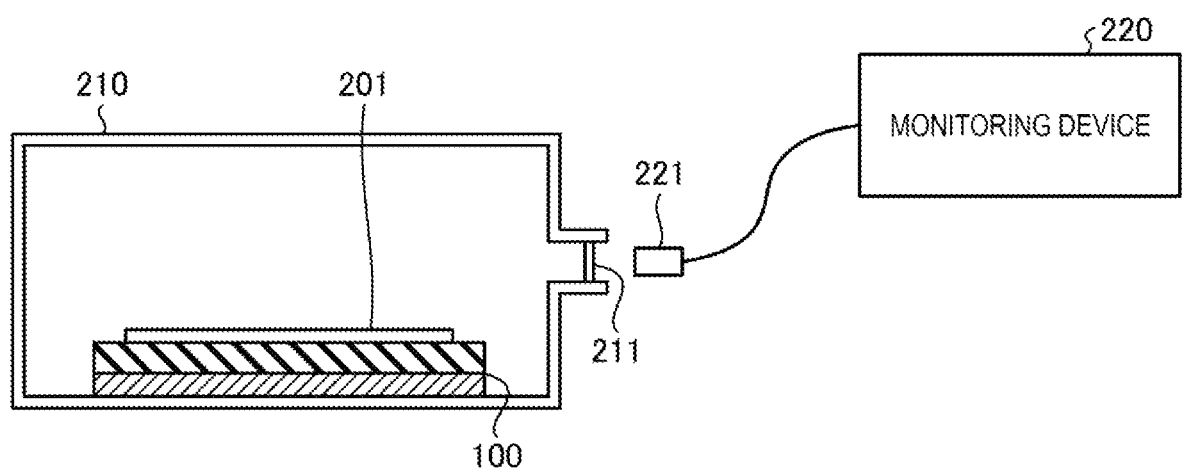
FIG. 4 shows a specific example of an etching monitoring system.

FIG. 4 shows a specific example of an etching monitoring system in the plasma etching process on the wafer.

In the plasma etching process, a wafer 201 sucked and fixed by the electrostatic chuck 100 is arranged in a chamber 210. At this time, the wafer 201 is sucked on the ceramic plate 120 of the electrostatic chuck 100, and the edge ring 130 at the periphery of the ceramic plate 120 is exposed without being covered by the wafer 201.

In the chamber 210, plasma is generated under predetermined conditions, so that a surface of the wafer 201 is etched. As the plasma, in general, a halide gas that is generated by introducing fluoride ($C_xF_y$ (for example, $CF_4$), $CH_xF_y$ (for example, $CHF_3$, $CH_2F_2$, $CH_3F$), $NF_3$, and the like) is used in many cases. In addition, $HBr/O_2$ plasma, $H_2/N_2$ plasma, and the like may be used according to a material of an etching target.

Aside surface of the chamber 210 is formed with a chamber window 211, so that an inside of the chamber 210 can be visually recognized. The chamber window 211 is formed using, for example, quartz glass or Pyrex glass, and the visible light having a wavelength of 400 nm or longer, for example, passes through the chamber window 211.

A light-condensing device 221 is provided near the chamber window 211. The light-condensing device 221 is configured to condense light in the chamber 210 through the chamber window 211, and to transmit the light to a monitoring device 220 via an optical fiber. Since the light-condensing device 221 condenses the light passing through the chamber window 211, it condenses the visible light having a wavelength of 400 nm or longer, for example.

The monitoring device 220 is configured to detect the light condensed by the light-condensing device 221 by an optical sensor, and to measure a wavelength, a light intensity and the like of the detected light. The plasma generation condition and the like in the chamber 210 are changed depending on a measurement result in the monitoring device 220.

Here, since the electrostatic chuck 100 in the chamber 210 has the edge ring 130, when the ultraviolet rays are irradiated to the wafer 201 as the plasma is generated in the chamber 210, the edge ring 130 emits photoluminescence light. Specifically, the ultraviolet rays that are irradiated to the wafer 201 are also irradiated to the edge ring 130, so that the visible light having a wavelength different from the ultraviolet rays is generated from the edge ring 130. For this reason, the light-condensing device 221 condenses the light from the chamber 210 through the chamber window 211, so that it is possible to monitor a generation situation of the ultraviolet rays in the chamber 210 by monitoring the light emission of the edge ring 130. The edge ring 130 emits the light even when the electromagnetic waves in the vacuum ultraviolet region in which the wavelength is 200 nm or shorter, for example, are irradiated. Therefore, even when the ultraviolet rays having a wavelength that does not pass through the chamber window 211 are generated in the chamber 210, it is possible to monitor a generation situation thereof.

As described above, according to the present embodiment, the electrostatic chuck is formed by forming the edge ring including cerium, which is a lanthanoid element, in the material and fitting the edge ring on the outer periphery of the ceramic plate for sucking the wafer. For this reason, when the ultraviolet rays are irradiated to the wafer sucked by the electrostatic chuck, the edge ring emits the photoluminescence light having a wavelength different from the ultraviolet rays, so that the generation of the ultraviolet rays can be detected. Therefore, in a semiconductor manufacturing process such as the plasma etching process in which the ultraviolet rays can be generated, it is possible to monitor a generation situation of the ultraviolet rays in the chamber, in which the wafer sucked on the electrostatic chuck is provided, from the chamber window.

Note that, in the above embodiment, the edge ring 130 that constitutes the electrostatic chuck 100 is formed of the material including a lanthanoid element. However, another member that constitutes the electrostatic chuck 100 may also be formed of a material including a lanthanoid element. Specifically, for example, the base plate 110, the ceramic plate 120 or another member (not shown) that constitutes the electrostatic chuck 100 may be formed of a material including a lanthanoid element such as cerium, for example. The member for an electrostatic chuck formed of a material including a lanthanoid element is preferably a member that is not completely covered by a wafer in a state where the wafer is sucked by the electrostatic chuck.

The electrostatic chuck 100 according to the above embodiment can also be used in an ultraviolet ray curing process of a constitutional film in a liquid crystal manufacturing process, a semiconductor manufacturing processing including an EUV (Extreme Ultraviolet rays) lithography process, and the like. Even in a case where the electrostatic chuck 100 is used in these processes, when the ultraviolet rays are irradiated to a target object sucked on the electrostatic chuck 100, the edge ring 130 emits light, so that it is possible to monitor a generation situation of the ultraviolet rays.

In the above embodiment, the edge ring 130 has a quadrangle shape in the cross-section as shown in FIG. 2. However, the edge ring 130 may have a shape different from the quadrangle shape in accordance with the shape of the ceramic plate 120. For example, the edge ring 130 can have an L-shape in the cross-section.

In the above embodiment, a planar shape of the edge ring 130 is a circular-ring-shape as shown in FIG. 1. However, the edge ring 130 may have a ring-shape different from the circular-ring-shape. For example, the edge ring 130 can have a triangle-ring-shape or quadrangle-ring-shape, and the like in accordance with the shape of the ceramic plate 120.

The edge ring 130 according to the above embodiment may include a heater embedded therein.

What is claimed is:

1. A member for an electrostatic chuck configured to suck a target object by using an electrostatic force,
   wherein a lanthanoid element is included in a part of a material of the member,
   wherein when electromagnetic waves in a wavelength region shorter than 400 nm are irradiated, the member emits light in a wavelength region different from the wavelength region of the electromagnetic waves,
   wherein the member is formed of ceramic including the lanthanoid element and having aluminum oxide as a main component, and
   wherein 90% or more of the ceramic consists of a corundum phase.

2. The member for an electrostatic chuck according to claim 1, wherein the ceramic includes a $CeAl_{11}O_{18}$ phase.

3. The member for an electrostatic chuck according to claim 1, wherein a content rate of the lanthanoid element is 0.5 to 10 mol %.

4. The member for an electrostatic chuck according to claim 1, wherein the lanthanoid element is cerium.

5. The member for an electrostatic chuck according to claim 3, wherein the lanthanoid element is cerium.

6. A member for an electrostatic chuck configured to suck a target object by using an electrostatic force,
   wherein a lanthanoid element is included in a part of a material of the member,
   wherein when electromagnetic waves in a wavelength region shorter than 400 nm are irradiated, the member emits light in a wavelength region different from the wavelength region of the electromagnetic waves,
   wherein the member is formed of ceramic including the lanthanoid element and having aluminum oxide and magnesium oxide as main components, and
   wherein 90% or more of the ceramic consists of a spinel phase.

7. The member for an electrostatic chuck according to claim 6, wherein a content rate of the lanthanoid element is 0.5 to 10 mol %.

8. The member for an electrostatic chuck according to claim 6, wherein the lanthanoid element is cerium.

9. The member for an electrostatic chuck according to claim 7, wherein the lanthanoid element is cerium.

10. An electrostatic chuck comprising:
    a base plate;
    a ceramic plate fixed to the base plate and configured to suck a target object by an electrostatic force that is generated as an embedded electrode is energized; and
    an edge ring fitted on an outer periphery of the ceramic plate,
    wherein a lanthanoid element is included in a part of a material of the edge ring,
    wherein when electromagnetic waves in a wavelength region shorter than 400 nm are irradiated, the edge ring emits light in a wavelength region different from the wavelength region of the electromagnetic waves,
    wherein the member is formed of ceramic including the lanthanoid element and having aluminum oxide as a main component, and
    wherein 90% or more of the ceramic consists of a corundum phase.

11. An electrostatic chuck comprising:
    a base plate;
    a ceramic plate fixed to the base plate and configured to suck a target object by an electrostatic force that is generated as an embedded electrode is energized; and
    an edge ring fitted on an outer periphery of the ceramic plate,
    wherein a lanthanoid element is included in a part of a material of the edge ring,
    wherein when electromagnetic waves in a wavelength region shorter than 400 nm are irradiated, the edge ring emits light in a wavelength region different from the wavelength region of the electromagnetic waves,
    wherein the member is formed of ceramic including the lanthanoid element and having aluminum oxide and magnesium oxide as main components, and
    wherein 90% or more of the ceramic consists of a spinel phase.

* * * * *